US006501404B2

(12) United States Patent
Walker

(10) Patent No.: US 6,501,404 B2
(45) Date of Patent: Dec. 31, 2002

(54) SYSTEM AND METHOD FOR ENCODING AN INPUT DATA STREAM BY UTILIZING A PREDICTIVE, LOOK-AHEAD FEATURE

(75) Inventor: Richard C. Walker, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 30 days.

(21) Appl. No.: 09/757,101

(22) Filed: Jan. 8, 2001

(65) Prior Publication Data

US 2002/0126027 A1 Sep. 12, 2002

(51) Int. Cl.$^7$ .............................................. H03M 3/00
(52) U.S. Cl. ......................... 341/143; 341/75; 341/138
(58) Field of Search ........................... 341/143, 77, 50, 341/160, 165, 75, 150, 138

(56) References Cited

U.S. PATENT DOCUMENTS

| 3,628,148 A | * 12/1971 | Brolin | 341/143 |
|---|---|---|---|
| 3,754,234 A | * 8/1973 | Laane et al. | 341/150 |
| 3,772,678 A | * 11/1973 | Deschenes et al. | 341/75 |
| 3,905,028 A | * 9/1975 | Wintz et al. | 341/143 |
| 4,901,077 A | 2/1990 | Christopher | 341/143 |
| 5,103,228 A | 4/1992 | Voorman et al. | 341/143 |
| 5,327,133 A | 7/1994 | Greene | 341/143 |
| 5,345,233 A | 9/1994 | Nagata et al. | 341/76 |
| 5,345,236 A | 9/1994 | Sramek, Jr. | 341/144 |
| 5,905,453 A | 5/1999 | Kase | 341/143 |
| 5,936,561 A | 8/1999 | Lee | 341/143 |
| 5,936,562 A | 8/1999 | Brooks et al. | 341/143 |

OTHER PUBLICATIONS

Benoit R. Veillette and Gordon W. Roberts, ISCAS 95, High Frequency Sinusoidal Generation Using Delta–Sigma Modulation Techniques, 1995. (No month).

Albert K. Lu, Gordon W. Roberts, and David A. Johns, IEEE Transaction on Circuits and Systems–II, A High–Quality Analog Oscillator Using Oversampling D/A Conversion Techniques, Jul., 1994, pp. 437–444.

David A. Johns and David M. Lewis, IEEE Transactions on Circuits and Systems–II, Design and Analysis of Delta–Sigma Based IIR Filters, Apr., 1993, pp. 233–240.

Benoit R. Veillette and Gordon W. Roberts, ISCAS 96, FM Signal Generation Using Delta–Sigma Oscillators, 1996. (No month).

M.F. Toner and G.W. Roberts, A BIST Scheme for an SNR Test of a Sigma–Delta ADS. (No date).

Motorola Telecommunications Device Data, Motorola Semiconductor Technical Data, pp. 2–62 through 2–79. (No date).

Gordon W. Roberts and Philip J. Crawley, Building Blocks for Switched–Current Sigma–Delta Converters, Chapter 14, pp. 351–380. (No date).

Max W. Hauser, J. Audio Eng. Soc. vol. 39, No. 12, 1991, Jan./Feb., Principles of Oversampling A/D Conversion, pp. 3–26.

* cited by examiner

*Primary Examiner*—Michael Tokar
*Assistant Examiner*—Jean Bruner Jeanglaude

(57) ABSTRACT

A method compares an input value of the input signal stream with an output value of an integration function of a previous binary value to generate a new binary value based upon the comparison. The method then stores a plurality of successive binary values from the comparing step, and simulates an integration function for a plurality of possible bit sequences of the plurality of successive binary values. Finally, the method determines which sequence results in the smallest error between the input signal stream and the output value of the integration function, and uses the most significant bit of the determined sequence to adjust the integration function. A corresponding apparatus is also provided.

20 Claims, 8 Drawing Sheets

SYSTEM AND METHOD FOR ENCODING AN INPUT DATA STREAM BY UTILIZING A PREDICTIVE, LOOK-AHEAD FEATURE

BACKGROUND OF THE INVENTION

1. Field of the Invention

The present invention generally relates to modulators, and more particularly to a system and method for encoding an input data stream by utilizing a predictive, look-ahead feature to modify the output in anticipation of large changes in the input.

2. Discussion of the Related Art

Delta encoders and sigma-delta encoders are well known devices that are used to convert a multi-valued sequence of data points into a binary stream of bits. FIGS. 1A and 1B are block diagrams that illustrate a first-order delta encoder and a first-order sigma-delta encoder, respectively. Although the two different types of encoders are implemented differently, their overall function is similar, and is well known by persons skilled in the art.

As illustrated in FIG. 1A, a delta encoder includes a comparator 10 and an integrator 15 configured as shown. An input signal 17 is provided to one input of the comparator 10, while the second input 19 of the comparator 10 is obtained from the output of the integrator 15. Generally, the integrator 15 is configured so that its output 20 attempts to track the output of the comparator 10. As is further known, delta encoders may be implemented in hardware, software, or a combination of the two. If implemented in software, a pseudo-code representation for the operation of a delta encoder may be as follows:

```
BEGIN
   Initialize Variables
   STEP=1
   Read input value into IVAL
   Compare with running integral (INTEG)
   If (IVAL>=INTEG),
      then BIT=STEP,
      else BIT=-STEP
   Increment INTEG by BIT
END.
```

In the above listing, the variable "STEP" defines the step size of the integrator 15. The larger the step size, the more quickly the integrator 15 may respond to changes in its input.

FIG. 1A also illustrates an integrator 16 that may be disposed within a decoder for receiving the compressed bit stream 21, after it has been communicated across a channel 22. In this configuration, the output of integrator 16 should closely match the output 20 of integrator 15. In this regard, and as is known, the integrated value of the bitstream output is a reasonably close estimate of the input stream (neglecting a possible DC offset).

For completeness, reference is made briefly to FIG. 1B, which is a block diagram illustrating a sigma-delta encoder. Like the delta encoder, the sigma-delta encoder operates to conduct a multi-valued sequence of data points into a binary stream of bits. A sigma-delta encoder is implemented with a summer (or adder) 32, an integrator 25 and a comparator 30, configured as shown in FIG. 1B. The output 40 is inverted at 42 and added to the input 27 by the adder 32. In this way, the output of the adder 32 is representative of an error signal (e.g., differential) between the input 27 and the output 40. This differential or error signal is fed to the integrator 25, which operates to track changes in the error signal. The output of the integrator 25 is then compared to zero by the comparator 30. As is known, the average value of the bitstream output is a reasonably close estimate of the input stream.

As should be understood, the output 40 is a compressed bit stream. A low-pass filter 34 may be disposed within a decoder to receive the compressed bit stream 40, after the bit stream 40 is communicated across a channel 36. The low-pass filter 34 operates to decode the received signal to recover, in essence, a signal that closely matches the input stream 27.

Hereinafter, the discussion will focus on delta encoders. However, it should be understood that the inventive concepts and features apply equally sigma-delta encoders as well.

Reference is now made to FIGS. 2A–2B, which are graphs illustrating the output of a delta encoder operating in accordance with the pseudo-code listing above, where the integrator 15 operates with a step size of 1. Referring first to FIG. 2A, an input signal 46 is shown having an irregular, step waveform defined by level, but changing values. In the illustrated example, the input stream begins at an amplitude near 100, then falls to an amplitude of slightly below zero, then to an amplitude of slightly less than −50, before rising to an amplitude of nearly +50. The output signal 48 is shown to significantly lag behind the input signal, where there are rapid changes in the input signal. As will be understood by persons skilled in the art, with the step size of one, the "slope" of the output signal will be a "1" unit voltage change per unit time (e.g., +45 degrees or −45 degrees, if the graph uses the same linear distance on they axis to represent a step voltage that it uses to represent a step in time). In regions like the region designated by reference numeral 50, where the output signal approximately equals the input signal, the output signal oscillates above and below the level of the input signal. The oscillations appear as noise, and the amplitude of the oscillations is equal to the step size.

In FIG. 2B, an input signal 56 is in the form of a sinusoidal waveform, of increasing frequency. As shown, the output signal 58 tracks the input signal, again having a substantial lag time between the output signal and the input signal.

Reference is now made to FIGS. 3A and 3B, which are graphs illustrating the operation of a delta encoder having a step size of 8. It should be noted that the graphs and waveforms set forth in the drawings are intended only to be illustrative of certain concepts, may not be accurately depicted to scale. The input waveforms 46 and 56 in FIGS. 3A and 3B are the same as those illustrated in FIGS. 2A and 2B. As illustrated, however, the output signals 58 and 68 respond much more quickly to changes in the input signals, due to the larger step size, However, in regions (like region 52) where the output is substantially the same as the input, a much larger amplitude of noise is observed. In order to obtain the benefits of large and small step sizes, delta encoders (and sigma-delta encoders) have been known to be configured with an adaptive step size. Encoders with adaptive step sizes dynamically adjust the operation of the integrator 15 based upon the differential between the input and output signals. An algorithm (pseudo-code) for a software implementation for such a system is provided immediately below (text following "#" is comment, and not part of pseudo-code).

```
BEGIN
   Initialize Variables
      EXPON=1.6 #an exponential increment
      SAME=0
```

Read input value into IVAL
Compare with running integral (INTEG)
If (IVAL>=INTEG),
   then BIT=1,
   else BIT=-1
If (BITOLD=BIT)
   Then SAME=SAME+1 #could limit to max of 8
   Else if (SAME>=2), then SAME=SAME-2
Increment INTEG by BIT*(EXPON)^SAME
BITOLD=BIT
END.

In the algorithm presented above, the step size is increased as the output continues to trail the input for successive integrations. Graphs illustrating the operations of an encoder having an adaptive step size are illustrated in FIGS. 4A and 4B. Specifically, the graphs in FIGS. 4A and 4B having input signals 46 and 56 that are the same as the input signals of FIGS. 2 and 3 as is illustrated, illustrate the operation of a delta encoder having an adaptive step size that aggressively tracks the input signal. However, as large, rapid changes are made in the input signal, the output signal causally lags the input. Although the output catches up quickly due to the adaptive step size, it is always late to respond. In certain applications, such as video applications, the use of such an encoder to encode the video signal will result in a shearing of the left-hand edge of highly contrasting objects in the video frame.

Accordingly, there is a desire to provide an encoder having a faster response to large changes in an input data stream.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve certain advantages and novel features, the present invention is generally directed to a system and method for encoding an input signal stream. In accordance with one aspect of the invention, a method operates to compare an input value of the input signal stream with an output value of an integration function of a previous binary value to generate a new binary value based upon the comparison. The method then stores a plurality of successive binary values from the comparing step. Thereafter, the method simulates an integration function for a plurality of possible bit sequences of the plurality of successive binary values. Then, the method determines which sequence results in the smallest error between the input signal stream and the output value of the integration function. Finally, the method uses the most significant bit of the determined sequence to adjust the integration function.

In accordance with one embodiment of the invention, the integration function is simulated for a plurality of possible bit sequences includes simulating an integration function for all possible bit sequences. In another embodiment, the method operates to determine which sequence results in the smallest error by calculating a root mean square (RMS) error value of the output value of the integration function and the input value. In the preferred embodiment, the method adaptively adjusts the step size of the integration function based upon successive values of the most significant bit of the determined sequence.

In accordance with another aspect of the invention, an encoder is provided for encoding an input signal stream. The encoder includes a comparator configured to compare an input value of the input signal stream with an output value of an integration function of a previous binary value to generate a new binary value based upon the comparison. The encoder further includes a memory configured to store a plurality of successive binary values from the comparator, and means for simulating an integration function for a plurality of possible bit sequences of the plurality of successive binary values. The comparator further includes means for determining which sequence results in the smallest error between the input signal stream and the output value of the integration function, and means for adjusting the integration function based upon the most significant bit of the determined sequence.

It should be appreciated that the various means elements may be implemented in hardware, software, or a combination of the two. In the preferred embodiment, the various means elements are predominately implemented in software.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1A:
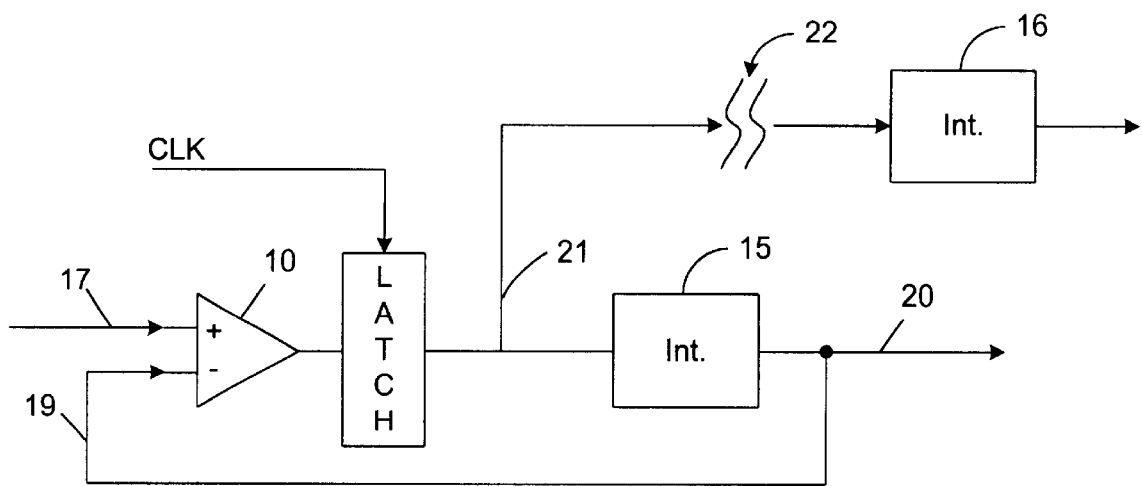
FIG. 1A is a block diagram illustrating a delta encoder, as is known in the prior art.
Figure 1B:
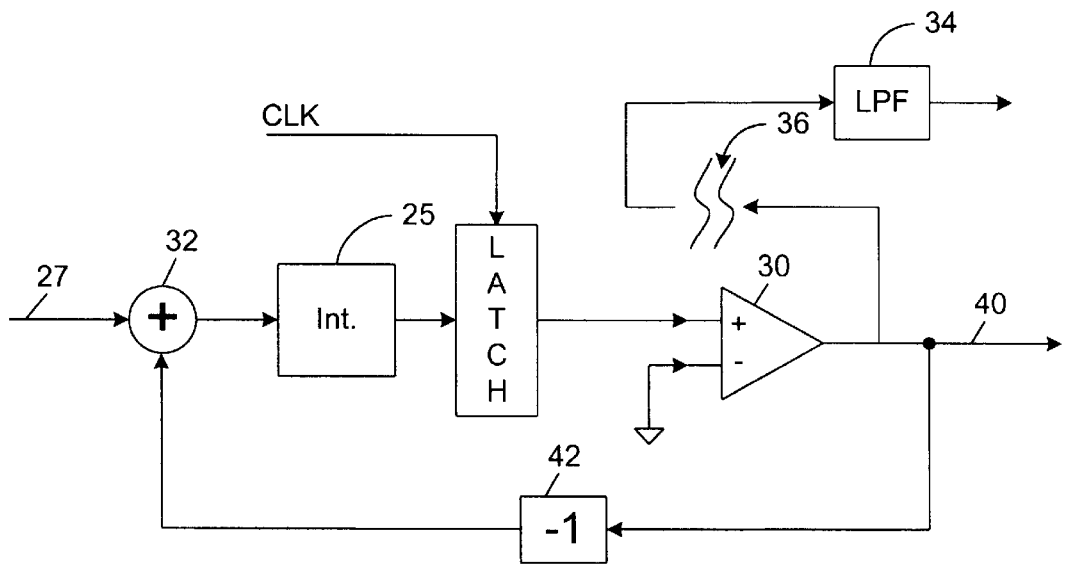
FIG. 1B is a block diagram illustrating a sigma-delta encoder, as is known in the prior art.

Having summarized various aspects of the present invention above, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

As summarized above, the present invention is directed to a method and apparatus for coding signals that utilize a look-ahead feature in connection with the coding. For purposes of the invention, the encoder may be implemented as a delta encoder, a sigma-delta encoder, or other similar encoder. Broadly, the look-ahead feature operates to look N samples ahead of the current integrator input, and adjusts the operation of the integrator based upon these future inputs. In the preferred embodiment, the invention effectively evaluates potential N-bit coder outputs, and modifies the operation of the integrator based upon an optimal set of N-bits that minimizes some metric of the coder distortion. In essence, the possible future states of the decoded output are checked for all possible choices of the N future input values, and all possible N-bit coder choices. The first bit of the single best N-bit pattern is used as the input to the coder algorithm. The process then repeats until the input values are exhausted. In this way, the choice of bits will have a side effect of adjusting the step size according to the adjustment algorithm.

In the preferred embodiment, the distortion metric is an RMS error. A graph illustrating the benefits obtained by the present invention is presented in FIG. 7, and will be discussed in further detail below.

Figure 5A:
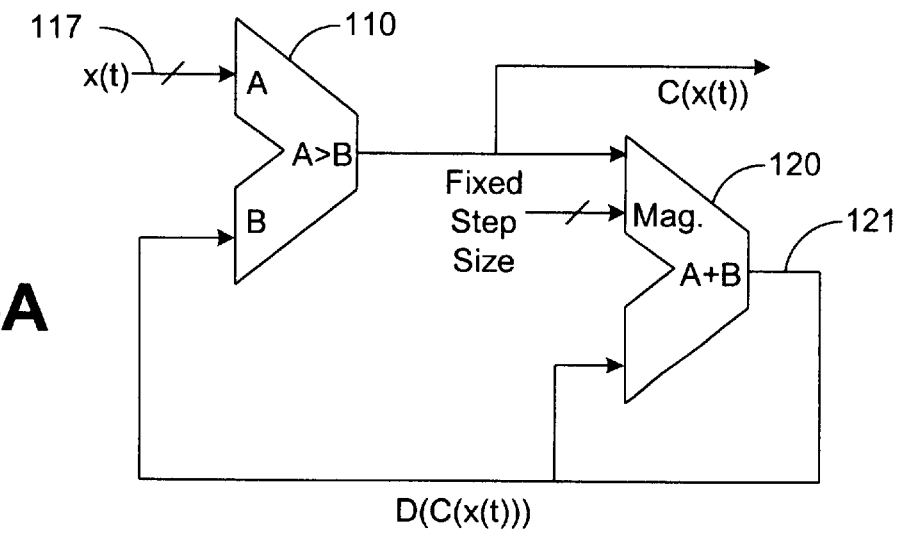
FIG. 5A is a block diagram illustrating the top-level features of a delta encoder constructed in accordance with the invention.

Reference is first made to FIG. 5A, which is a block diagram illustrating a delta encoder, having a fixed step size, constructed in accordance with an embodiment of the invention. In this embodiment, an input stream 117 is input to an input of a comparator 110. The output of this comparator 110 is a compressed bit stream. An adder 120 is also provided. The adder 120 may be configured to add a fixed step size to its own output 121, which is fed back to a second input of the comparator 110. In the illustrated embodiment, the output of the comparator 110 is configured to control the sign of the sign of the step sized. That is, the output of the comparator 110 controls whether the step size is added to the output of the adder 120, or whether the step size is subtracted from the output of the adder 120. It will be appreciated that the functional configuration of FIG. 5A provides a relatively simple implementation of a delta mod encoder having a fixed step size. Consistent with the scope and spirit of the invention, however, other embodiments may be implemented as well.

Figure 5B:
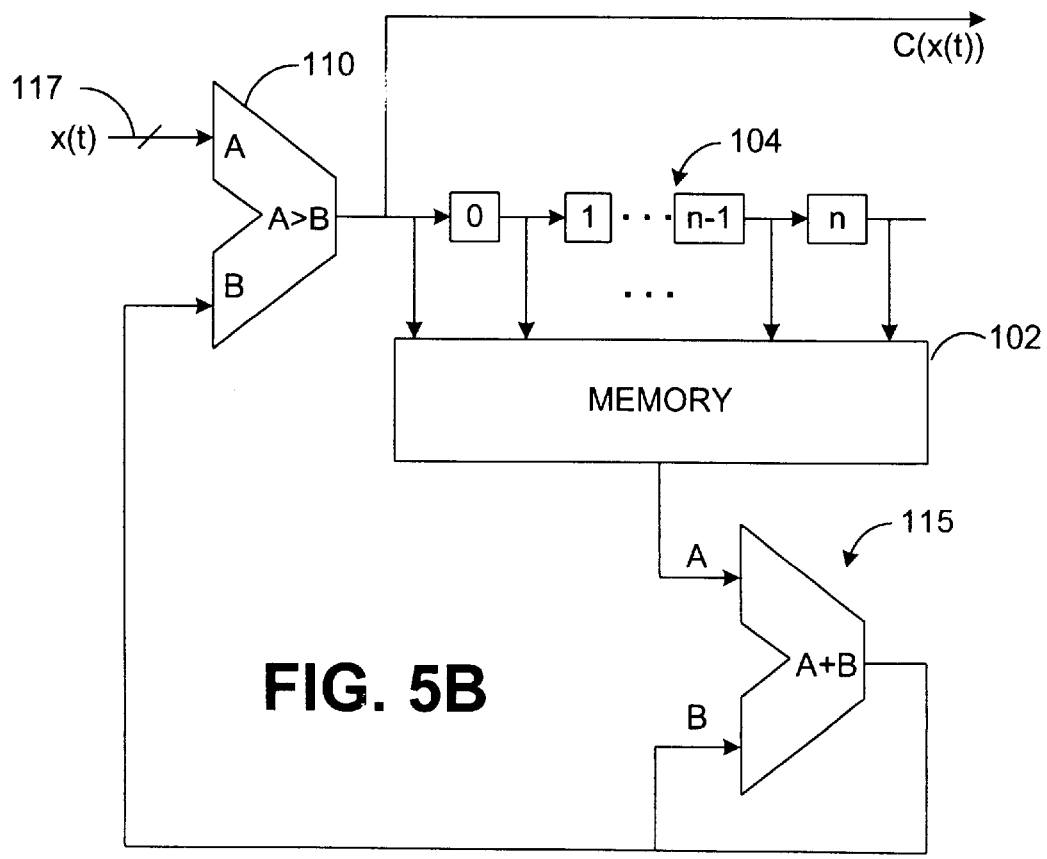
FIG. 5B is a block diagram similar to FIG. 5A, but illustrating an implementation with an adaptive step size.

Reference is now made to FIG. 5B, which is a block diagram illustrating a delta encoder, having an adaptive step size, constructed in accordance with another embodiment of the invention. In this embodiment, a memory 102 is interposed between the comparator 110 and the integrator 115 (implemented with an adder) of a conventional delta encoder. In order for the integrator 115 to adaptively adjust its step size, multiple, successive inputs are first stored to the encoder. In this regard, an input stream is provided on signal line 117, which contains an analog signal that is passed to the comparator 110. The output of the comparator 110 is a binary value of either logic 1 or logic 0 (of course, the actual signal amplitude may vary depending upon the particular implementation). In one embodiment, the memory 102 may be configured in the form of a shift register so that each successive binary value output from the comparator 110 is shifted into a single-bit register location 104. Alternatively, a RAM or other memory device 102 may be provided and configured to store successive bits that are later addressable by the integrator 115. As is illustrated, the output of the comparator 110 may be input to a shift register 100 (illustrated as discrete blocks), and the shift register 100 outputs drive the input (e.g., address) of a lookup table (the memory 102). In turn, the output of the lookup table 102 may control the integration step size.

Figure 6:
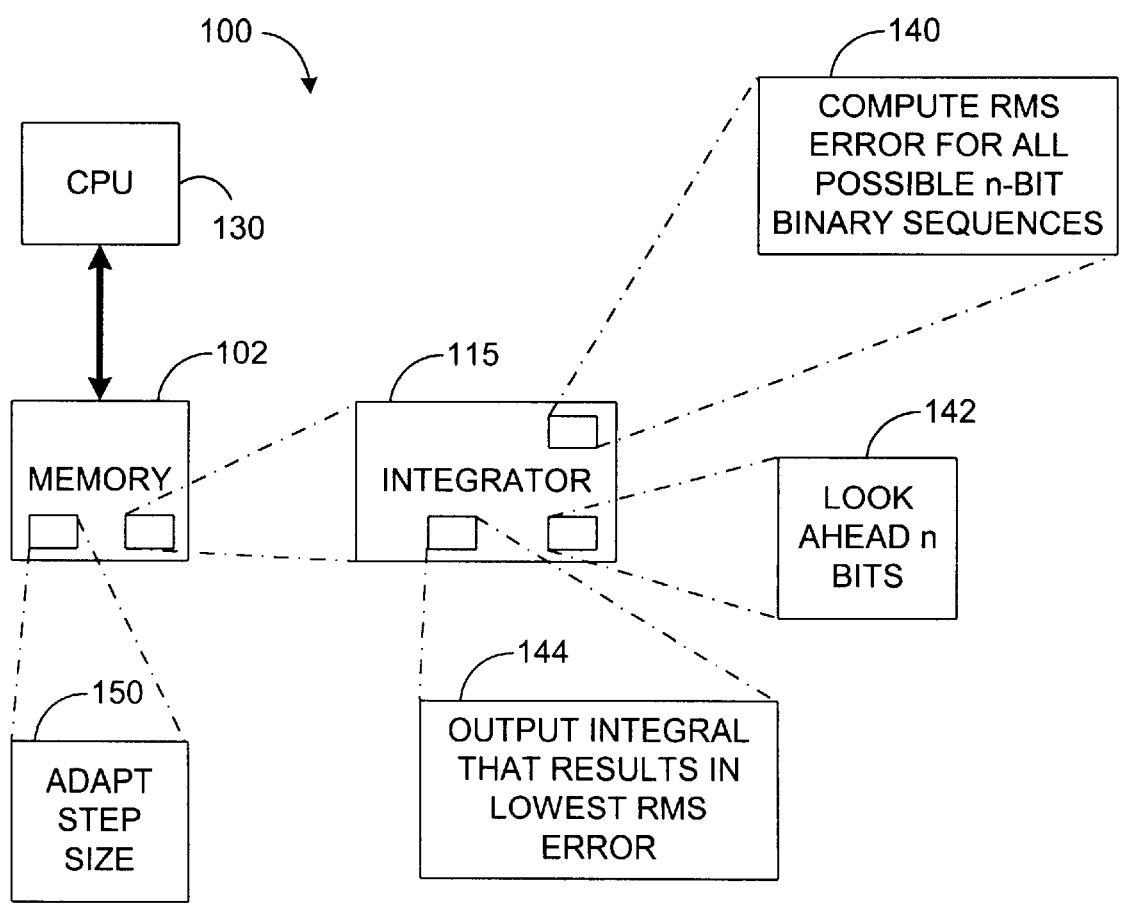
FIG. 6 is a block diagram illustrating various features of a delta encoder constructed in accordance with the invention.

It should be appreciated that the encoder of the present invention may be implemented in hardware, software, or a combination of the two. In this regard, the block 100 is further presented in FIG. 6, in the context of a predominantly software implementation. Of course, memory element 102 and a CPU 130 are hardware components that operate to carry out the functional aspects of the block 100. However, other components (including the integrator 115) may be implemented in software, and specifically, may take the form of code segments. There are different functional blocks, which may be implemented as separate code segments. Some such functional blocks are illustrated in FIG. 6. It should be appreciated, however, that the present invention should not be limited in construction to the embodiments illustrated in FIGS. 5A, 5B, and 6, but rather that these embodiments are illustrative of only one embodiment that implements the look-ahead feature of the present invention.

Before further discussing the diagram of FIG. 6, a pseudo-code algorithm is presented below for implementing a simple first-order sigma-delta coder with an adaptive step size and look-ahead feature in accordance with one embodiment of the present invention.

```
BEGIN {
    # initialize variables
    alpha=1.6 # step size increment
    nlook=8 # number of bits lookahead
    decode=0
    int1=0
    bit=0
}
// {
    # read all input values into value [ ]array
    # we need to do this so to allow lookahead
    value [i++]=$2
}
END {
    # now code the values
    for (z=0; z<=i; z++){
        bit=look (int1, int2, value, z, nlook, alpha, same,
            bitold);
        # exponential deltamod coder
        # algorithm checks for multiple comparisons
        # in the same direction and then compensates
        # by increasing the coder stepsize
        if (bit==bitold) {
            same=min (8, same +1)
        } else { # reduce gain faster than building
            if (same>=2) { # do not let same fall below zero!
                Same-=2
            }
        }
        bitold=bit
        # increment integral by step size
        int1+=bit*(alpha) ^same
        printf ("%d %d\n", count++, int1);
    }
}
function min (a,b) {
    if (a<b) {
        return (a);
    } else {
        return (b);
    }
}
function look (int1, int2, value, x, nlook, alpha, same,
    bit1old, curpos) {
```

```
# for each of the possible codes:
for (k=0, k<2^(nlook); k++) {
    xyy=k
    # make local copy of integral value
    xint1=int1
    xint2=int2
    xsame=same
    xbit1old=bit2old
    xcurpos=curpos
    # zero out the error counter
    xerror [k]=0
    xcount=0
    # for each bit of this code
    for (n=nlook-1; n>=0; n--) {
        xcount++
        if (xyy>=2^n) {
            xbit1=1
            xyy-+2^n
        } else {
            xbit1=-1
        }
        #######################################
        ###########
        #bounded binary search deltamod coder
        #######################################
        ###########
        if (xbit1==xbit1old) {
            xsame=min (8, xsame+1)
        } else { #reduce gain faster than building
            if (xsame>=2) { #do not let fall below zero!
                Xsame-=2
            }
        }
        xbit1old=xbit1
        # increment integral by step size
        xint1+=xbit1*(alpha) ^same
        xerror [k]+=(xint1-value [x+xcount-1])^2
    }
}
err=1e9
for (y=0; y<2^(nlook); y++) {
    if (xerror[y]<err) {
        #print "x=" x, "y=" y, "error=" xerror[y]
        err=xerror [y]
        besty=y
    }
}
if (besty>=2^(nlook-1)) {
    return 1
else }
    return-1
}
}
```

In short, the look-ahead feature of the invention allows an encoder to consider future inputs to the integrator. By identifying and accounting for large changes in an integrator input, the operation of the integrator may be adjusted in advance, so that the output of the integrator does not significantly lag inputs, due to large changes in the input data stream. In fact, the integrator may actually be configured to begin adjusting its output in anticipation of large input changes.

As mentioned above, in one embodiment the system comprises software that may be provided on a computer readable storage medium in the form of code segments that are particularly configured to perform various functions. FIG. 6 illustrates a few such functions, which may be carried out by a system constructed in accordance with the teachings of the invention. For example, the code segment 115 may comprise a plurality of smaller code segments, including a segment 140 for computing a RMS error value for all possible binary look-ahead sequences entering the integrator 115. Another segment 142 may be provided for looking ahead N bits. This segment may control the retrieval and storage of the various look-ahead values output from the comparator 110. Still another segment 144 may be configured to output an integral value that results in the lowest RMS error. Another segment 150 may be configured to dynamically adjust the step size of the integrator 115. Yet additional segments (not illustrated) may be provided in connection with the system of the present invention, as will be appreciated by persons of skill in the art in light of the teachings provided herein.

Figure 2A:
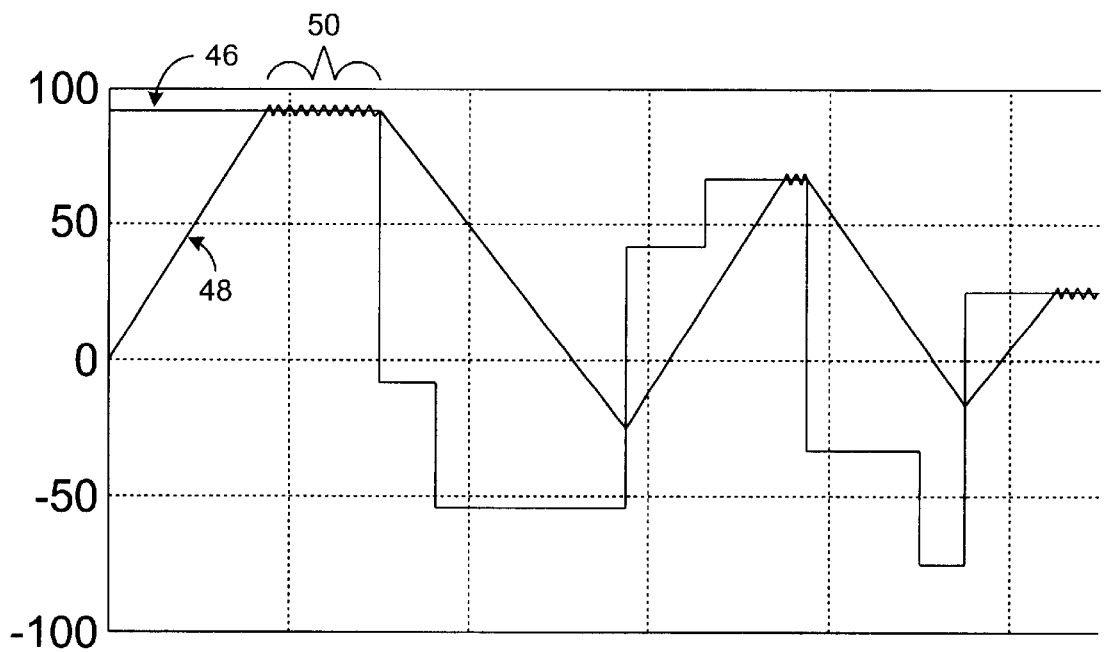
FIGS. 2A and 2B are graphs illustrating the operation of a delta encoder with a small constant step size, as implemented in a known prior art delta encoder.
Figure 2B:
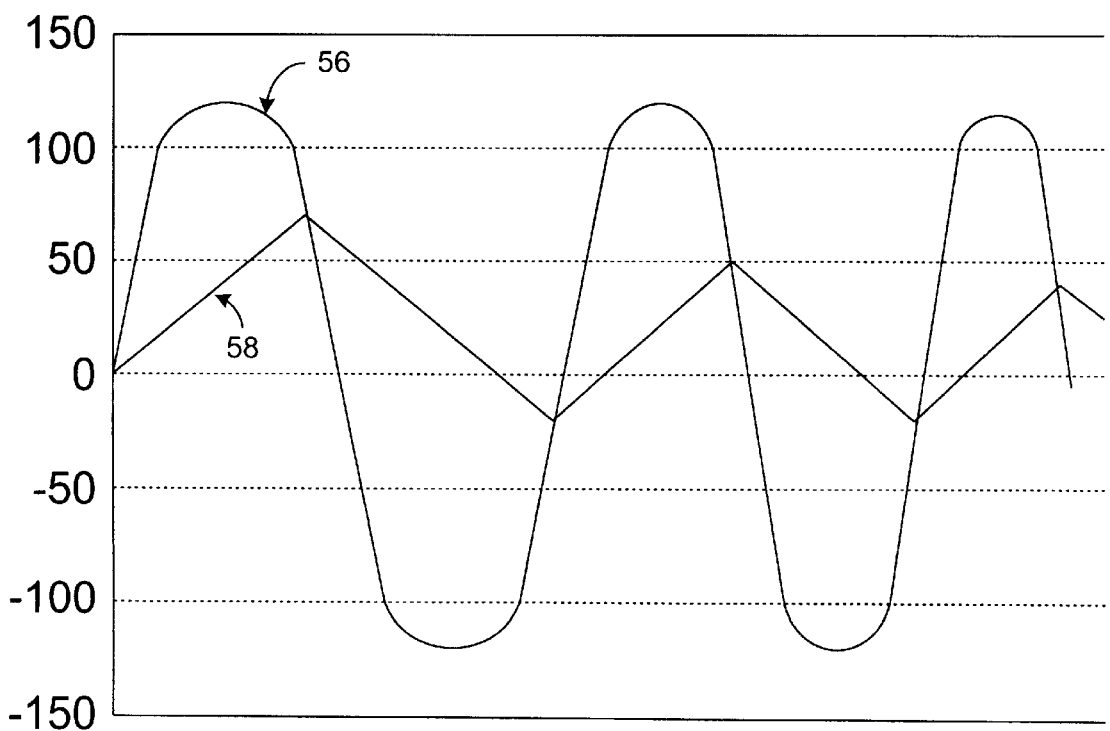
Figure 3A:
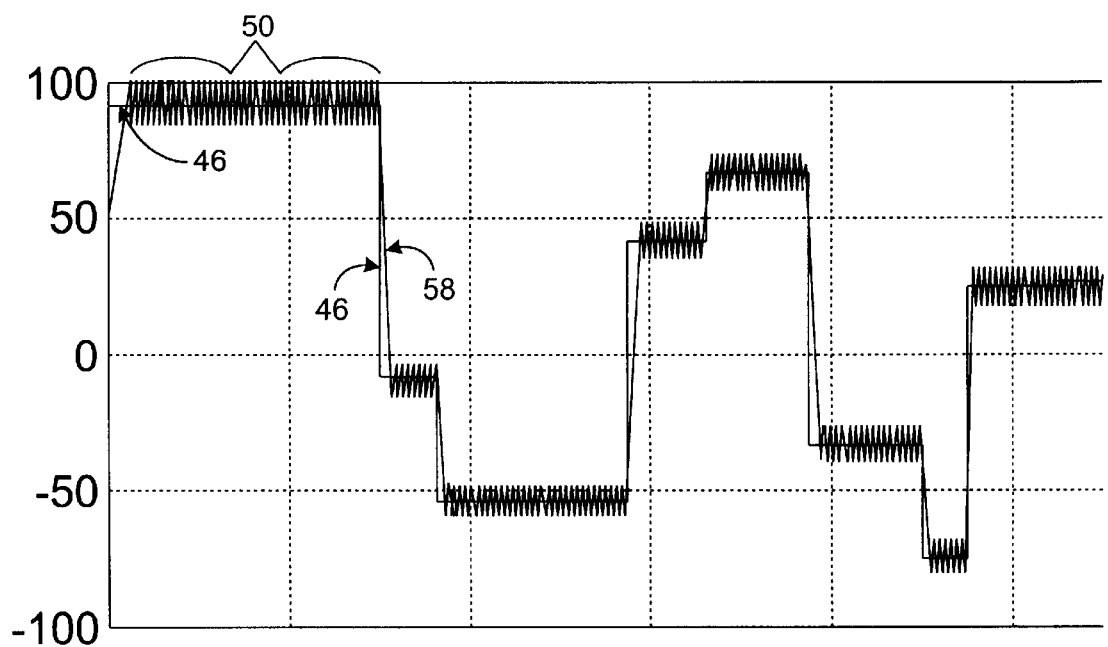
FIGS. 3A and 3B are graphs illustrating the operation of a delta encoder with a larger constant step size, as implemented in a known prior art delta encoder.
Figure 3B:
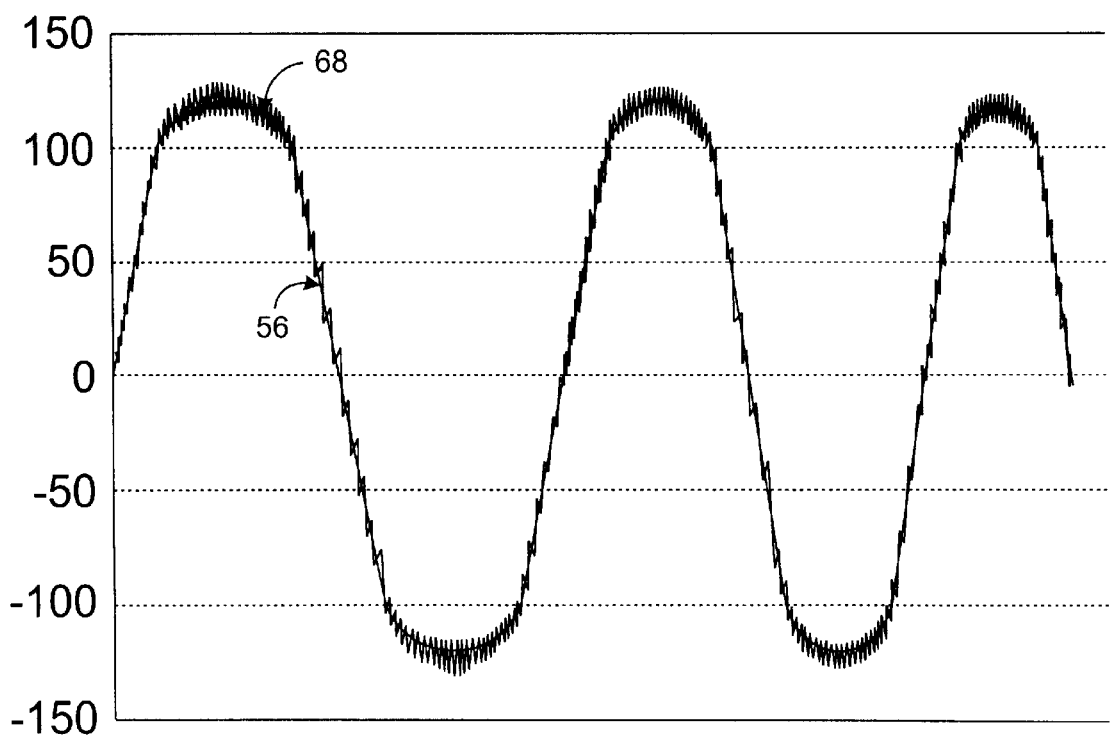
Figure 4A:
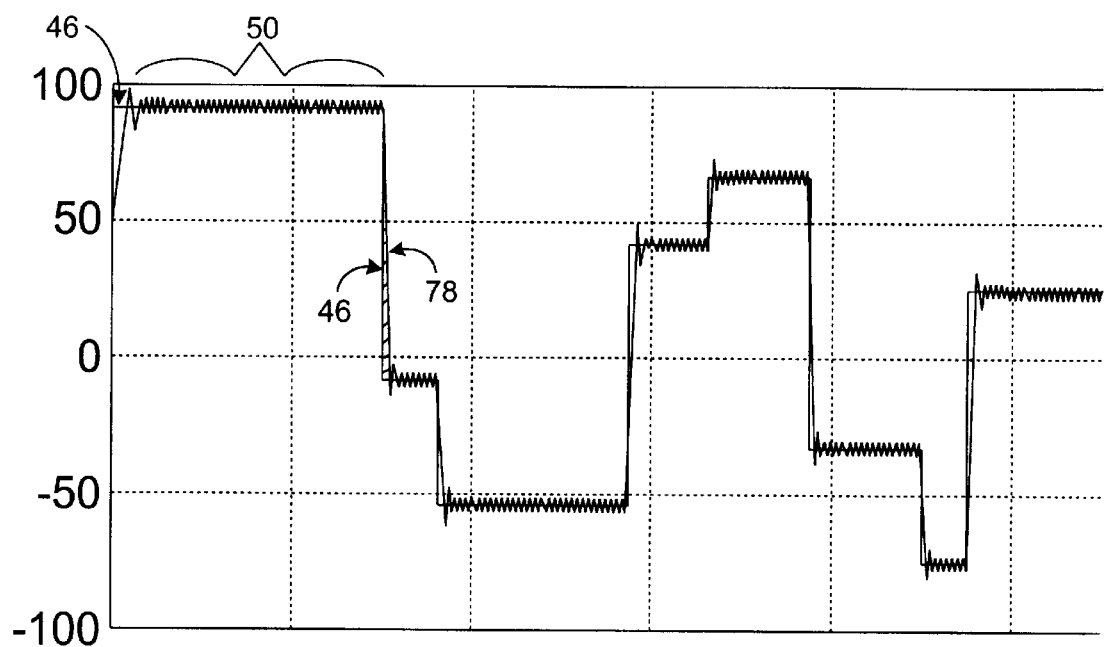
FIGS. 4A and 4B are graphs illustrating the operation of a delta encoder with an adaptive step size, as implemented in a known prior art delta encoder.
Figure 4B:
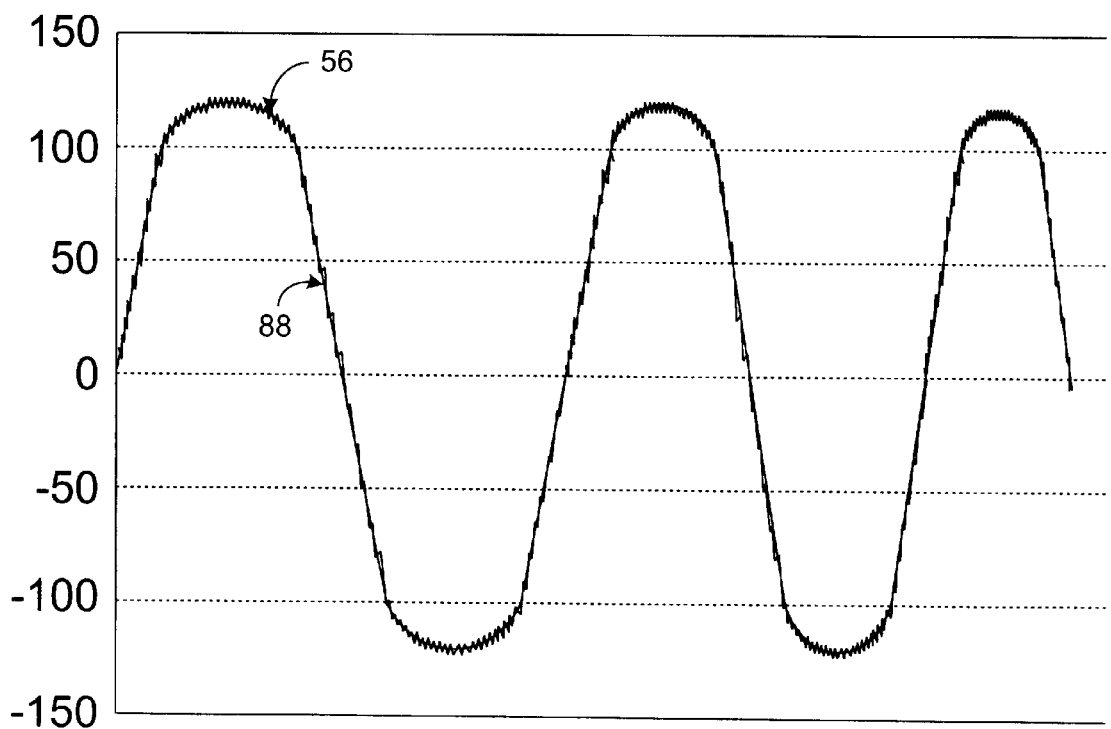
Figure 7:
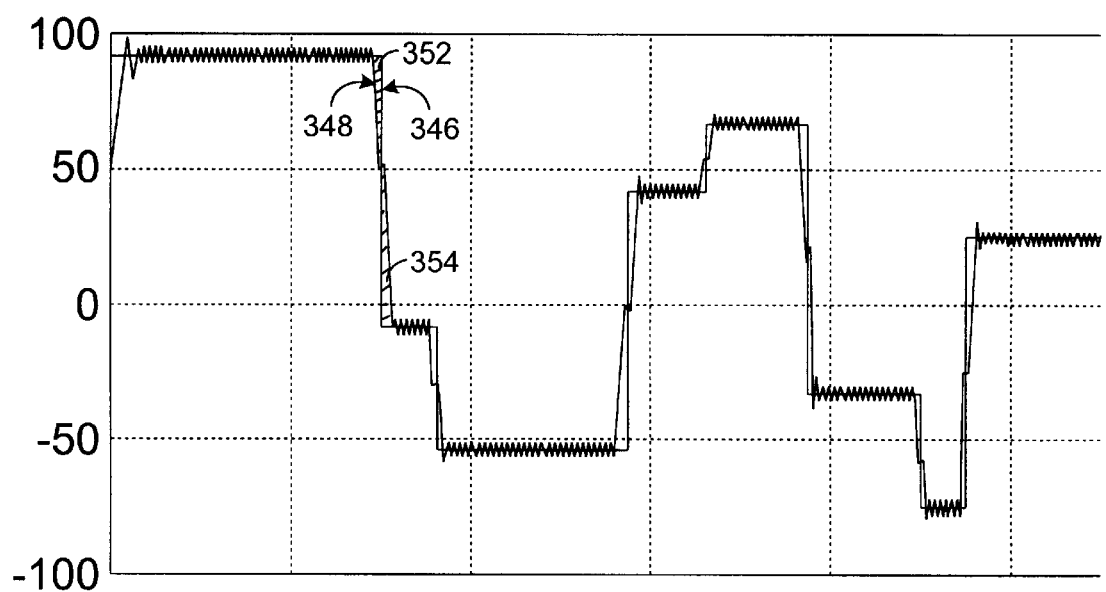
FIG. 7 is a graph illustrating the operation of a delta encoder constructed in accordance with one aspect of the present invention.
Figure 8:
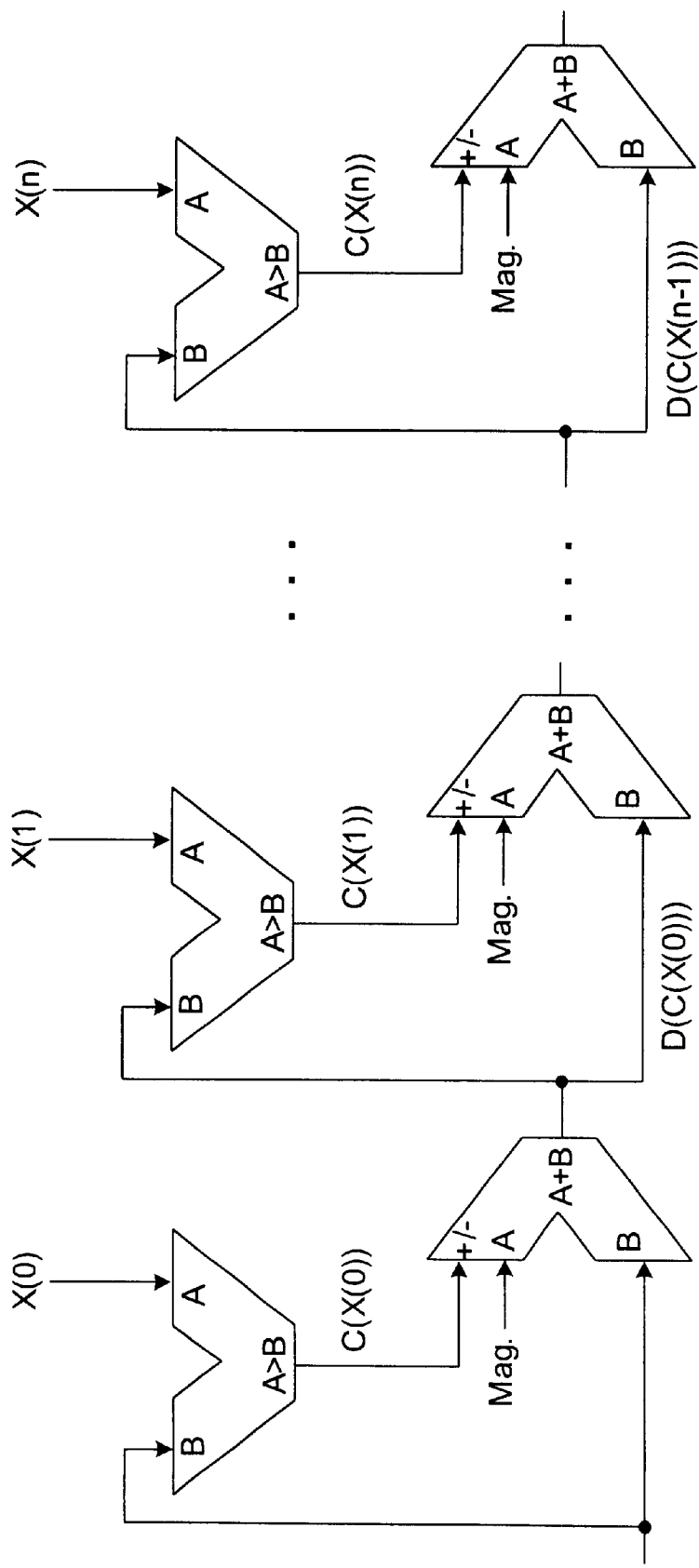
FIG. 8 is a block diagram of an "unrolled" delta-sigma modulator with look-ahead.

Having described the look-ahead feature of the present invention, reference is now made to FIG. 7, which is a graph that illustrates the operation of a delta encoder implementing the look-ahead feature of the present invention. Specifically, the graph includes an input waveform 346 and an output waveform 348. The input waveform is similar to the input waveform 46 of FIGS. 2A, 3A and 4A. The output waveform 348, however, more closely tracks the input waveform, than the output waveform 78 of FIG. 4A. In this regard, FIG. 4A illustrates a region 70 (in crosshatch shading) that emphasizes the lag of the output signal 78 behind the input signal 46. In contrast, the shaded regions 352 and 354 illustrate that the output signal 348 actually changes in advance of the change in the input signal 346. In the preferred embodiment, the look-ahead feature is used to control the operation of the integrator so that the area represented by crosshatched regions 352 and 354 is minimized. In other words, these areas are representative of the RMS error. Thus, for large changes in the input signal 346, the output signal 348 will begin to change before the input signal changes, in order to prevent an excessive lag, such as those that result in systems of the prior art.

In applications such as video encoding and transmission, the practical and perceived result is an image having much crisper and clearer quality than that which is obtained from systems of the prior art.

Having described an embodiment and implementation of the look-ahead feature of the invention, it should be appreciated that this feature may be combined with other features known in the prior art to obtain even further enhancements over that described herein. For example, the delta encoder disclosed herein is a first order delta coder. The inventive, look-ahead concept of the present invention, however, is equally applicable to higher order coders as well. In another adaptation, in the context of a video application, rather than looking ahead, several data samples of a given stream of video data, a similar concept may be applied on a frame by frame basis of video signals. In this regard, entire frames of video data may be stored in a look-ahead memory and delta (or sigma-delta) coding techniques may be applied to the video information of successive frames. Recognizing that in most video applications, the subject matter of the frame often does not change between successive frames, delta coding may be utilized to provide a much sharper image within just a few successive frames of video. That is, the look-ahead feature of the invention may be applied on a frame by frame basis, to obtain performance enhancement not heretofore known in systems of the prior art.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for encoding an input signal stream comprising the steps of:

comparing an input value of the input signal stream with an output value of an integration function of a previous binary value to generate a new binary value based upon the comparison;

storing a plurality of successive binary values from the comparing step;

simulating an integration function for a plurality of possible bit sequences of the plurality of successive binary values;

determining which sequence results in the smallest error between the input signal stream and the output value of the integration function; and using the most significant bit of the determined sequence to adjust the integration function.

2. The method as defined in claim 1, wherein the step of simulating an integration function for a plurality of possible bit sequences includes simulating an integration function for all possible bit sequences.

3. The method as defined in claim 1, wherein the step of determining which sequence results in the smallest error further includes the step of calculating a root mean square (RMS) error value of the output value of the integration function and the input value.

4. The method as defined in claim 1, wherein the step of using the most significant bit of the determined sequence further includes adaptively adjusting a step size of the integration function based upon the most significant bit of the determined sequence.

5. The method as defined in claim 4, further including the step of adaptively adjusting the step size of the integration function based upon successive values of the most significant bit of the determined sequence.

6. The method as defined in claim 1, wherein the step of storing a plurality of successive binary values includes storing eight successive binary values.

7. The method as defined in claim 1, wherein the method modulates the input signal stream in accordance with a delta encoding algorithm.

8. The method as defined in claim 1, wherein the method modulates the input signal stream in accordance with a sigma delta encoding algorithm.

9. In an encoder having a comparator for comparing an input value of an input signal stream with an output value of an integration function, wherein the integration function operates on a binary value previously output from the comparator, a method for adjusting the integration function to encode the input signal stream, the improvement comprising the step of looking ahead to future binary values to the integration function and adjusting the integration function accordingly.

10. The method as defined in claim 9, wherein the step of looking ahead includes the step of simulating an integration function for a plurality of possible bit sequences of the plurality of successive binary values.

11. The method as defined in claim 10, wherein the step of simulating an integration function for a plurality of possible bit sequences includes simulating an integration function for all possible bit sequences.

12. The method as defined in claim 10, further including the step of determining which sequence results in the smallest error between the input signal stream and the output value of the integration function.

13. The method as defined in claim 12, further including the step of using the most significant bit of the determined sequence to adjust the integration function.

14. The method as defined in claim 9, wherein the comparator and the integration function are configured as a delta encoder.

15. The method as defined in claim 9, wherein the comparator and the integration function are configured as a sigma delta encoder.

16. An encoder for encoding an input signal stream comprising:

a comparator configured to compare an input value of the input signal stream with an output value of an integration function of a previous binary value to generate a new binary value based upon the comparison;

memory configured to store a plurality of successive binary values from the comparator;

means for simulating an integration function for a plurality of possible bit sequences of the plurality of successive binary values;

means for determining which sequence results in the smallest error between the input signal stream and the output value of the integration function; and means for adjusting the integration function based upon the most significant bit of the determined sequence.

17. The encoder as defined in claim 16, wherein the encoder is implemented in hardware.

18. The encoder as defined in claim 16, wherein the encoder is implemented in software.

19. A computer readable storage medium containing program code to implement the encoder as defined in claim 18.

20. The encoder as defined in claim 16, wherein the comparator and the integration function are configured as a delta encoder.

* * * * *